United States Patent
Wu

(10) Patent No.: US 10,348,297 B2
(45) Date of Patent: Jul. 9, 2019

(54) HIGH POWER COMPACT ALTERNATE CURRENT VOLTAGE REDUCING POWER STRIP

(71) Applicant: Hongsheng Wu, Dongguan (CN)

(72) Inventor: Hongsheng Wu, Dongguan (CN)

( * ) Notice: Subject to any disclaimer, the term of this patent is extended or adjusted under 35 U.S.C. 154(b) by 129 days.

(21) Appl. No.: 15/791,424

(22) Filed: Oct. 24, 2017

(65) Prior Publication Data

US 2019/0103868 A1  Apr. 4, 2019

(51) Int. Cl.
*H03K 17/725* (2006.01)
*H02H 3/08* (2006.01)

(52) U.S. Cl.
CPC .......... *H03K 17/725* (2013.01); *H02H 3/085* (2013.01)

(58) Field of Classification Search
CPC .............................. H03K 17/725; H02H 3/085
See application file for complete search history.

(56) References Cited

U.S. PATENT DOCUMENTS

| | | | | |
|---|---|---|---|---|
| 7,969,047 B2* | 6/2011 | Hu | .......... | H01R 13/66 307/140 |
| 2013/0113382 A1* | 5/2013 | Kitahara | .......... | H03K 17/08 144 315/151 |
| 2016/0379771 A1* | 12/2016 | Liu | .......... | H01H 9/54 307/113 |
| 2017/0353180 A1* | 12/2017 | Guo | .......... | H03K 17/725 |

* cited by examiner

*Primary Examiner* — Jared Fureman
*Assistant Examiner* — Duc M Pham

(57) ABSTRACT

The present invention relates to a high power compact alternate current voltage reducing power strip which comprises an input end and an output end; a high power bidirectional thyristor circuit is positioned between the input end and the output end; the high power bidirectional thyristor circuit controls output voltage at the output end according to voltage level at the input end; the high power bidirectional thyristor circuit performs control by a relay control circuit in cooperation with a sampling drive trigger circuit; the relay control circuit is controlled by a rectifier filter comparison sampling circuit; the rectifier filter comparison sampling circuit performs rectification, filter, sampling and comparison on power supply from the input end, so that power fulfilling the voltage requirement is directed to the operating sockets at the output end, thereby ensuring power.

8 Claims, 2 Drawing Sheets

HIGH POWER COMPACT ALTERNATE CURRENT VOLTAGE REDUCING POWER STRIP

BACKGROUND OF THE INVENTION

The present invention relates to power strip and more particularly pertains to power strip control technology.

According to market research, users in territories with 110V voltage electric supply such as USA, Japan and Canada like to travel to Europe and worldwide by bringing along various electrical appliances (such as hair dryers, electric hair curlers, crimping irons, electric kettles, computers and other various household appliances). However, the power for current full-voltage voltage-reducing power supply is only 200 W, which could supply power to low power electrical appliances such as notebook computers and mobile chargers; moreover, the input voltage of these low power electrical appliances is full voltage, and thus such power supply is not applicable for single voltage electrical appliances such as hair dryers and electric hair curlers due to their high power.

BRIEF SUMMARY OF THE INVENTION

In view of the aforesaid disadvantages now present in the prior art, the present invention provides a high power compact alternate current voltage reducing power strip which fulfills needs.

To attain this, the present invention adopts the following technical proposal:

The high power compact alternate current voltage reducing power strip comprises an input end and an output end; a high power bidirectional thyristor circuit is positioned between the input end and the output end; the high power bidirectional thyristor circuit controls output voltage at the output end according to voltage level at the input end; the high power bidirectional thyristor circuit performs control by a relay control circuit in cooperation with a sampling drive trigger circuit; the relay control circuit is controlled by a rectifier filter comparison sampling circuit; the rectifier filter comparison sampling circuit performs rectification, filter, sampling and comparison on power supply from the input end.

In the above proposal, the rectifier filter sampling and comparison circuit is a dual-path circuit with a first path supplying power to the relay control circuit for achieving comparison and control, and a second path supplying power to the output end.

In the above proposal, the relay control circuit supplies operating voltage to trigger a thyristor into conduction by closing relay contact; when the relay control circuit opens relay contact the sampling drive trigger circuit is energized to drive a bidirectional thyristor into conduction and reduce voltage output.

In the above proposal, the sampling drive trigger circuit comprises resistors R20, R21, R22 and a regulator tube ZENER3, wherein the resistors R20 and R22 are connected in parallel and then connected in series with the resistor R21 and the regulator tube ZENER3; another end of the regulator tube ZENER3 connects to a bidirectional thyristor control gate of the high power bidirectional thyristor circuit.

In the above proposal, a bidirectional thyristor Q1 of the high power bidirectional thyristor circuit is connected in parallel to a voltage reducing circuit formed by a resistor R1 and a capacitor C2.

In the above proposal, the input end is provided with a temperature control and overload switch circuit which automatically cuts off circuit output when electrical current is too large and temperature exceeds 100 degrees Celsius.

In the above proposal, the input end leads to a USB output port via a switching power supply circuit.

The high power compact alternate current voltage reducing power strip of the present invention performs rectification, filter, sampling and comparison on the power supply of the input end via the rectifier filter comparison sampling circuit, so that power fulfilling the voltage requirement is directed to the operating sockets at the output end, thereby ensuring power. When the voltage is high, the voltage after detection is reduced for output via the high power bidirectional thyristor circuit, thus fulfilling power requirements; it is also convenient to carry due to compact size.

DETAILED DESCRIPTION OF THE INVENTION

The concepts, structures and technical effects of the present invention will be described in detail with the accompanying drawings for better comprehension of the the objects, characteristics and effects of the present invention.

Figure 1:
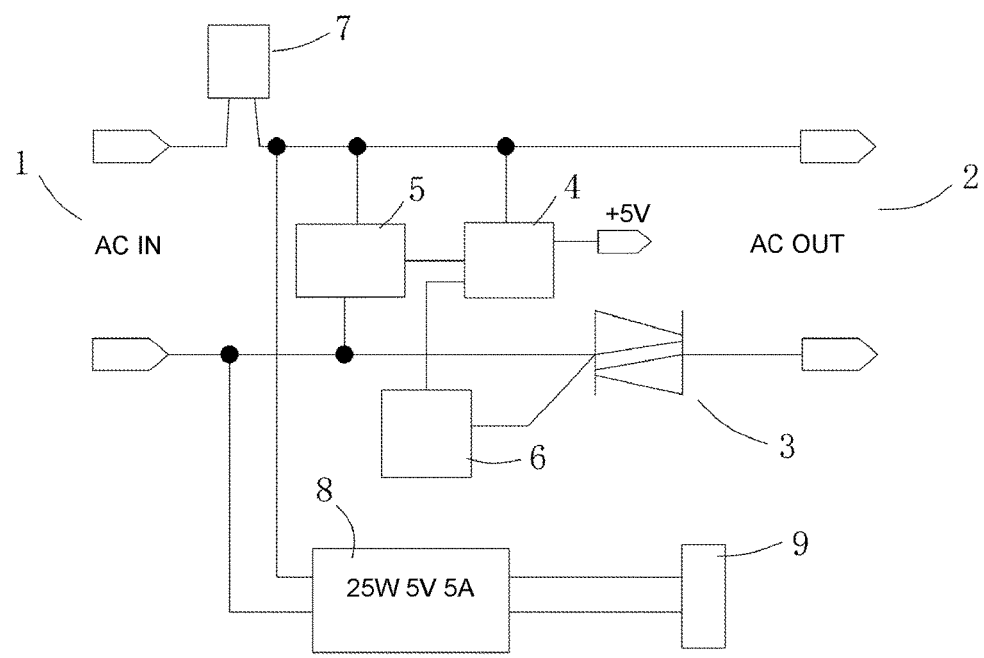
FIG. 1 is a block diagram of the present invention.
Figure 2:
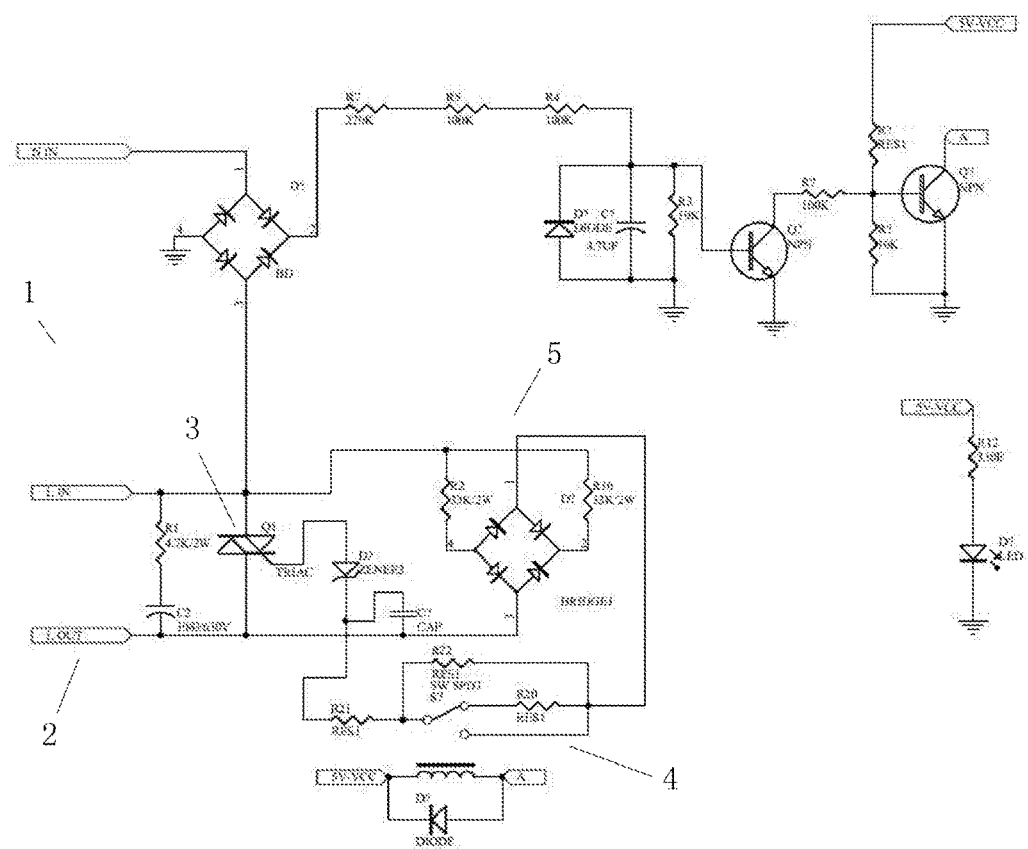
FIG. 2 is a circuit diagram of the present invention.

FIGS. 1 and 2 illustrate the structure of a preferred embodiment of the present invention. The high power compact alternate current voltage reducing power strip has an input end 1 and an output end 2. A high power bidirectional thyristor circuit 3 is positioned between the input end and the output end. The high power bidirectional thyristor circuit 3 controls output voltage at the output end according to voltage level at the input end. The high power bidirectional thyristor circuit 3 performs control by a relay control circuit 4 in cooperation with a sampling drive trigger circuit 6. The relay control circuit 4 is controlled by a rectifier filter comparison sampling circuit 5. The rectifier filter comparison sampling circuit 5 performs rectification, filter, sampling and comparison processing on power supply of the input end 1; power which fulfills voltage requirements is directed to the operating sockets at the output end, thereby ensuring power. When the voltage is high, the voltage is output by the high power bidirectional thyristor circuit 3 after detection, thus fulfilling power requirements; it is also convenient to carry due to compact size.

As illustrated in FIGS. 1 and 2, in the present embodiment, the rectifier filter comparison sampling circuit 5 is a dual-path circuit with a first path supplying power to the relay control circuit 4 via a rectifier bridge BRIDGE1 for achieving comparison and control, and a second path supplying power to the output end 2. The relay control circuit 4 supplies operating voltage to trigger the thyristor into conduction by closing relay contact; when the relay control circuit 4 opens relay contact the sampling drive trigger circuit 6 is energized to drive bidirectional thyristor into conduction and reduce voltage output. In the figures, the sampling drive trigger circuit 6 comprises resistors R20, R21, R22 and a regulator tube ZENER3, wherein the resistors R20 and R22 are connected in parallel and then connected in series with the resistor R21 and the regulator tube ZENER3. Another end of the regulator tube ZENER3 connects to a bidirectional thyristor control gate of the high power bidirectional thyristor circuit 3. A bidirectional thyristor Q1 of the high power bidirectional thyristor circuit 3 is connected in parallel to a voltage reducing circuit formed by the resistor R1 and the capacitor C2 connected in series, preferably the reduced voltage output of the high power bidirectional thyristor circuit 3 is half of input voltage. The input end 1 is provided with a temperature control and overload switch circuit 7 which automatically cut off circuit output when the current is too large and when the temperature exceeds 100 degrees Celsius. The input end 1 further leads to a USB output port 9 via a switching power supply circuit 8. The USB performs intelligent identification to fulfill different needs.

The major markets of the present invention are territories with 120V voltage such as USA, Japan, Canada and so forth. Therefore, the power strip body is provided with 3 or 4 American outlets. When the power supply voltage is connected to AC 90V-130V (i.e. the voltage of the input end 1), the rectifier filter comparison sampling circuit 5 performs voltage comparison after electric current detection; when the mains supply is below 130V, the relay control circuit 4 supplies operating voltage to trigger the thyristor into conduction by closing relay contact, thereby supplying power to the power strip and ensuring power. When the power supply is connected to a mains supply of 130V or above, the rectifier filter comparison sampling circuit 5 detects a high level and conduct comparison, the relay control circuit 4 then closes the relay contact and conducts the sampling drive trigger circuit 6 to drive operation of the bidirectional thyristor and reduce output voltage to output 50% voltage to fulfill needs.

The high power compact alternate current voltage reducing power strip of the present invention performs rectification, filter, sampling and comparison on the power supply of the input end via the rectifier filter comparison sampling circuit, so that power fulfilling the voltage requirement is directed to the operating sockets at the output end, thereby ensuring power. When the voltage is high, the voltage after detection is reduced for output via the high power bidirectional thyristor circuit, thus fulfilling power requirements; it is also convenient to carry due to compact size.

In the present invention, the input end 1 is provided with a temperature control and overload switching circuit 7 to automatically cut off power output when the electric current is too large and the temperature exceeds 100 degrees Celsius, thus it is safe to use. The input end 1 leads to the USB output port 9 via the switching power supply circuit 8, thereby providing different ports for fulfilling different needs, and thus enhancing applicability of the present invention.

The present invention is described in detail by the above embodiment. Such description is only intended to illustrate the technical concept and feature of the present invention, and aims to enable the persons skilled in the art to comprehend and implement the present invention. It should not limit the scope of protection of the present invention. Therefore, any equivalent changes or modifications based on the spirits of the present invention falls within the scope of the present invention.

What is claimed is:

1. A high power compact alternate current voltage reducing power strip, characterized in that, it comprises an input end (1) and an output end (2); a high power bidirectional thyristor circuit (3) is positioned between the input end and the output end; the high power bidirectional thyristor circuit (3) controls output voltage at the output end according to voltage level at the input end; the high power bidirectional thyristor circuit (3) performs control by a relay control circuit (4) in cooperation with a sampling drive trigger circuit (6); the relay control circuit (4) is controlled by a rectifier filter comparison sampling circuit (5); the rectifier filter comparison sampling circuit (5) performs rectification, filter, sampling and comparison on power supply from the input end.

2. The high power compact alternate current voltage reducing power strip as in claim 1, characterized in that the rectifier filter comparison sampling circuit (5) is a dual-path circuit with a first path supplying power to the relay control circuit (4) for achieving comparison and control, and a second path supplying power to the output end (2).

3. The high power compact alternate current voltage reducing power strip as in claim 1 or 2, characterized in that the relay control circuit (4) supplies operating voltage to trigger a thyristor into conduction by closing relay contact; when the relay control circuit (4) opens relay contact the sampling drive trigger circuit (6) is energized to drive a bidirectional thyristor into conduction and reduce voltage output.

4. The high power compact alternate current voltage reducing power strip as in claim 3, characterized in that the sampling drive trigger circuit (6) comprises resistors R20, R21, R22 and a regulator tube ZENER3, wherein the resistors R20 and R22 are connected in parallel and then connected in series with the resistor R21 and the regulator tube ZENER3; another end of the regulator tube ZENER3 connects to a bidirectional thyristor control gate of the high power bidirectional thyristor circuit (3).

5. The high power compact alternate current voltage reducing power strip as in claim 1, characterized in that a bidirectional thyristor Q1 of the high power bidirectional thyristor circuit (3) is connected in parallel to a voltage reducing circuit formed by a resistor R1 and a capacitor C2 connected in series.

6. The high power compact alternate current voltage reducing power strip as in claim 1, characterized in that the input end (1) is provided with a temperature control and overload switch circuit (7) which automatically cuts off circuit output when electrical current is too large and temperature exceeds 100 degrees Celsius.

7. The high power compact alternate current voltage reducing power strip as in claim 1, characterized in that the input end (1) leads to a USB output port (9) via a switching power supply circuit (8).

8. The high power compact alternate current voltage reducing power strip as in claim 3, characterized in that the high power bidirectional thyristor circuit (3) has a reduced voltage output which is half of input voltage.

* * * * *

UNITED STATES PATENT AND TRADEMARK OFFICE
CERTIFICATE OF CORRECTION

PATENT NO. : 10,348,297 B2
APPLICATION NO. : 15/791424
DATED : July 9, 2019
INVENTOR(S) : Hongsheng Wu Page 1 of 1

It is certified that error appears in the above-identified patent and that said Letters Patent is hereby corrected as shown below:

On the Title Page

After Item (65) "Prior Publication Data"
US 2019/0103868 A1   Apr. 4, 2019

Insert Item (30) -- Foreign Application Priority Data
Sept. 29, 2017 (CN) ------------------ 201710911775.8 --

Signed and Sealed this
Seventeenth Day of September, 2019

Andrei Iancu
*Director of the United States Patent and Trademark Office*